US007363777B2

(12) United States Patent
Davidson

(10) Patent No.: US 7,363,777 B2
(45) Date of Patent: Apr. 29, 2008

(54) CLOSED CASSETTE AND METHOD FOR HEAT TREATING GLASS SHEETS

(75) Inventor: Ronald A. Davidson, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 429 days.

(21) Appl. No.: 10/794,938

(22) Filed: Mar. 5, 2004

(65) Prior Publication Data

US 2005/0193772 A1 Sep. 8, 2005

(51) Int. Cl.
*C03B 27/00* (2006.01)

(52) U.S. Cl. .............................. 65/111; 65/114; 65/117; 432/121

(58) Field of Classification Search .................. 65/111, 65/63, 69, 41, 95, 114, 117, 118, 157, 194, 65/254, 274, 289, 104, 24, 25.2, 102, 106, 65/182.1, 182.2, 348, 355; 134/48; 432/184, 432/204, 120, 121, 210; 34/202; 271/198, 271/264, 7

See application file for complete search history.

(56) References Cited

U.S. PATENT DOCUMENTS

| | | | | |
|---|---|---|---|---|
| 1,534,864 A | * | 4/1925 | Oliver et al. ............... | 432/121 |
| 2,026,165 A | * | 12/1935 | Goodwillie ................... | 65/114 |
| 3,338,696 A | | 8/1967 | Dockerty ..................... | 65/145 |
| 3,682,609 A | | 8/1972 | Dockerty ..................... | 65/83 |
| 3,809,234 A | * | 5/1974 | Kurick ........................ | 206/448 |
| 4,086,263 A | * | 4/1978 | Rowley ....................... | 206/454 |
| 4,488,192 A | * | 12/1984 | Treseder ................... | 360/97.03 |
| 5,711,778 A | * | 1/1998 | House ......................... | 65/117 |
| 5,974,833 A | * | 11/1999 | Vaha-Antila et al. ......... | 65/102 |
| 6,053,011 A | * | 4/2000 | Lisec .......................... | 65/104 |

(Continued)

FOREIGN PATENT DOCUMENTS

JP 11079388 A 3/1999
JP 11079389 A 3/1999

OTHER PUBLICATIONS

Paul W. Roos, "Lehr Priority: Design Concepts to Save Energy", The Glass Industry, Apr. 1975.

(Continued)

*Primary Examiner*—Carlos Lopez
*Assistant Examiner*—Queenie Dehghan
(74) *Attorney, Agent, or Firm*—William J. Tucker; Christopher Nicastri; Thomas Beall

(57) ABSTRACT

A convection compatible closed cassette and method are described herein where the closed cassette is used to heat treat (compact) one or more glass sheets in a uniform manner and in a clean environment. In the preferred embodiment, the closed cassette includes multiple enclosed sections that are supported by a mounting structure in a manner where there is an open passageway between the major surfaces of each pair of the supported enclosed sections. And, each enclosed section is designed to hold and support multiple glass sheets in a manner where there is a space between the major surfaces of each pair of the supported glass sheets. In operation, the closed cassette is placed into an oven (e.g., lehr, batch kiln) so that hot/cold unfiltered air can flow across the major surfaces of each enclosed section and uniformly heat/cool the enclosed glass sheets.

12 Claims, 6 Drawing Sheets

U.S. PATENT DOCUMENTS

| | | | |
|---|---|---|---|
| 6,150,239 A | 11/2000 | Goesele et al. | 438/458 |
| 6,176,023 B1* | 1/2001 | Doche | 34/451 |
| 6,537,938 B1 | 3/2003 | Miyazaki | 501/66 |
| 6,588,232 B1* | 7/2003 | Suzuki et al. | 65/32.3 |
| 2002/0033189 A1 | 3/2002 | Macris | 136/203 |

OTHER PUBLICATIONS

T.-H Lee et al., "Semiconductor Layer Transfer By Anodic Wafer Bonding", Proceedings 1997 IEEE International SOI Conference, Oct. 1997, pp. 40-41.

* cited by examiner

CLOSED CASSETTE AND METHOD FOR HEAT TREATING GLASS SHEETS

BACKGROUND OF THE INVENTION

1. Field of the Invention

The present invention relates to a closed cassette and method for using the closed cassette to heat treat (compact) one or more glass sheets in a uniform manner and in a clean environment.

2. Description of Related Art

Manufacturers of glass sheets (e.g., liquid crystal display (LCD) glass sheets) often heat treat the glass sheets to pre-shrink them so they will not shrink or shrink very little when their customers process the glass sheets. Today there are several systems/processes the manufacturers use to heat treat the glass sheets. Three of these systems/process and their associated problems are briefly described below with respect to FIGS. 1-3.

First, the manufacturers can use as shown in FIG. 1 a re-circulating air oven 100 to heat treat glass sheets 112. The re-circulating air oven 100 circulates unfiltered air 102 around one or more large steel muffles 104 where in this example only two muffles 104 are shown one of which is located on a top shelf 106 and the other muffle 104 is located a bottom shelf 108. Each muffle 104 contains multiple open cassettes 110 where in this example each muffle 104 contains fifteen open cassettes 110 of which only five of the open cassettes 110 can be seen on each of the shelves 106 and 108 shown in the side view of FIG. 1. And, each open cassette 110 supports multiple glass sheets 112 where in this example each open cassette 110 is shown to support six glass sheets 112. The muffles 104 are used to isolate the open cassettes 110 from the unfiltered air 102 flowing in the re-circulating air oven 100. The main problems associated with this system/process is that (1) long thermal cycles are needed to heat and cool the glass sheets 112 and (2) the heat/cold transfer and temperature uniformity within each muffle 104 is poor.

Second, the manufacturers can use as shown in FIG. 2 a direct convection oven 200 to heat treat glass sheets 206. The direct convection oven 200 circulates air 202 that has been filtered by one or more high efficiency particulate (HEPA) filters 203 (e.g., one HEPA filter 203) around multiple open cassettes 204 each of which supports multiple glass sheets 206 (e.g., six glass sheets 206). In this example, the direct convection oven 200 supports thirty open cassettes 204 of which only five open cassettes 204 can be seen on a top shelf 208 which is shown in the side view of FIG. 2. And, five open cassettes 204 can be seen on a bottom shelf 210 which is shown in FIG. 2. The direct convection oven 200 uses filtered air 202 to uniformly heat and cool the glass sheets 206. The main problem associated with this system/process is that the HEPA filter 203 has a maximum operating temperature of about 350° C. when the glass sheets 206 need to be heated up to 650° C. to be properly heat treated. It should be appreciated that the system/process and in particular the direct convection oven 200 shown in FIG. 2 is simply a conceptual drawing that is used to help describe a problem associated with using the traditional open cassette 204. As such, this system/process may or may not be used in industry today.

Third, the manufacturers can use as shown in FIG. 3 a radiant oven 300 to heat treat glass sheets 304. The radiant oven 300 radiates heat/cold around one or more open cassettes 302 each of which supports multiple glass sheets 304 (e.g., six glass sheets 304). In this example, the radiant oven 300 supports thirty open cassettes 302 of which only five open cassettes 302 can be seen on a top shelf 306 which is shown in the side view of FIG. 3. And, five open cassettes 302 can be seen located and on a bottom shelf 308 which is shown in FIG. 3. The radiant oven 300 does not use forced convection heating or cooling due to concerns with blowing particles onto the glass sheets 304. As such, the radiant oven 300 simply radiates heat/cold to heat treat the glass sheets 304. The main problem associated with this system/process is that it is difficult for the radiant oven 300 to uniformly heat and cool the glass sheets 304. It should be appreciated that the system/process and in particular the radiant oven 300 shown in FIG. 3 is simply a conceptual drawing that is used to help describe a problem associated with using the traditional open cassette 302. As such, this system/process may or may not be used in industry today.

In view of the problems associated with the traditional systems/processes shown in FIGS. 1-3, there is a need for a system/process that can address the aforementioned shortcomings of the traditional systems/processes by effectively heat treating multiple glass sheets in a uniform manner and in a clean environment. This need and other needs are provided by the convection compatible closed cassette, method and system of the present invention.

BRIEF DESCRIPTION OF THE INVENTION

The present invention includes a convection compatible closed cassette and a method for using the closed cassette to heat treat (compact) one or more glass sheets in a uniform manner and in a clean environment. In the preferred embodiment, the closed cassette includes multiple enclosed sections that are supported by a mounting structure in a manner where there is an open passageway between the major surfaces of each pair of the supported enclosed sections. And, each enclosed section is designed to hold and support multiple glass sheets in a manner where there is a space between the major surfaces of each pair of the supported glass sheets. In operation, the closed cassette is placed into an oven (e.g., lehr, batch kiln) so that hot/cold unfiltered air can flow across the major surfaces of each enclosed section and uniformly heat/cool the enclosed glass sheets.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE DRAWINGS

Figure 1:
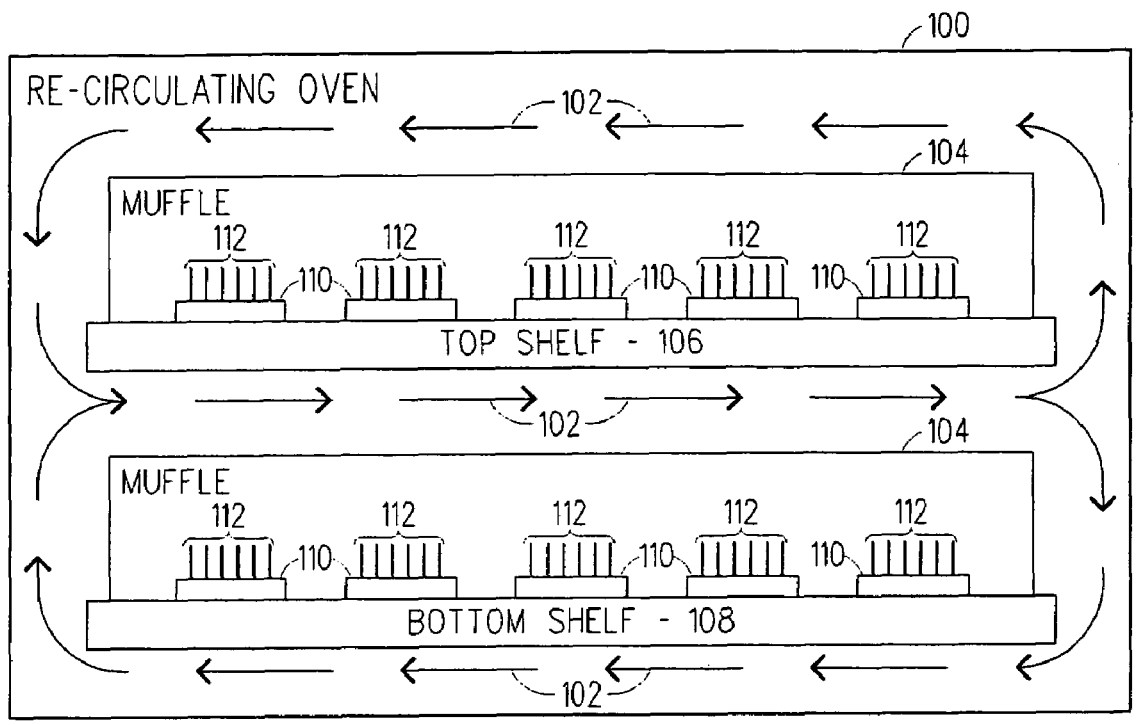
FIG. 1 (PRIOR ART) is a block diagram illustrating a traditional system including a re-circulating air oven, muffles and open cassettes that are currently used to heat treat multiple glass sheets.
Figure 2:
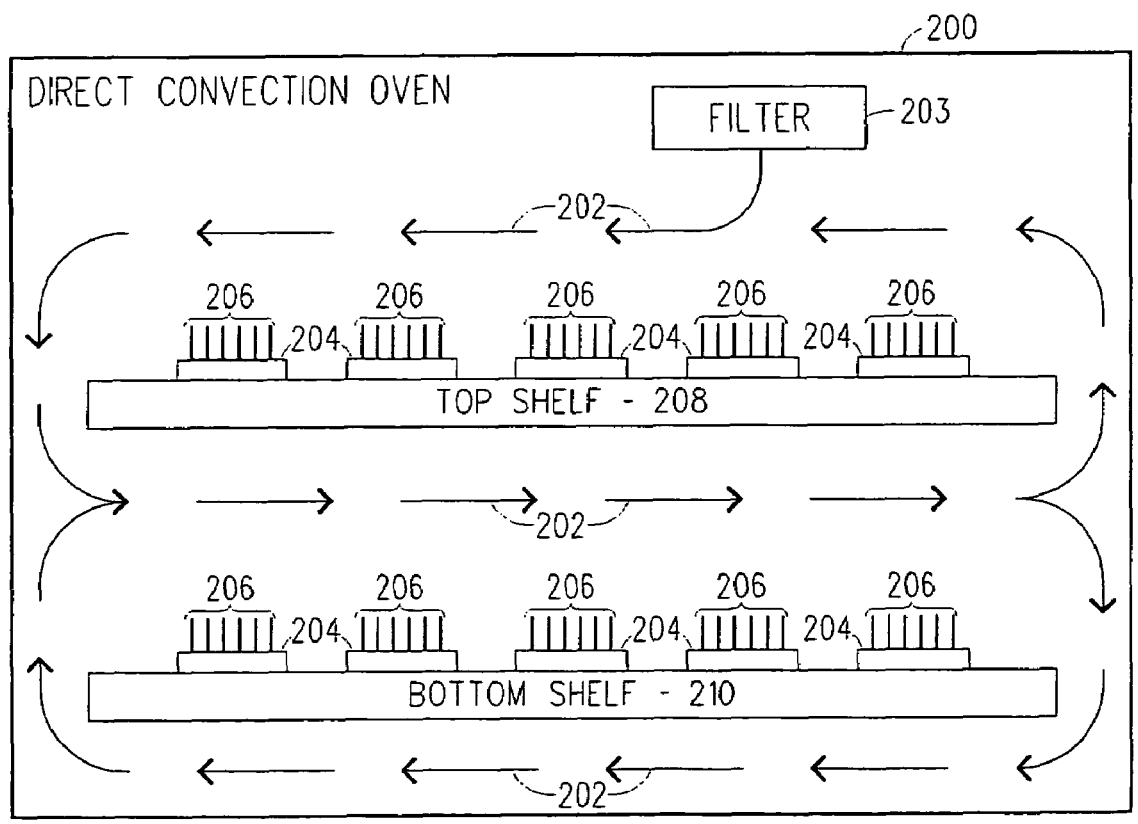
FIG. 2 (PRIOR ART) is a block diagram illustrating another traditional system including a direct convection oven, a HEPA filter and open cassettes that are currently used to heat treat multiple glass sheets.
Figure 3:
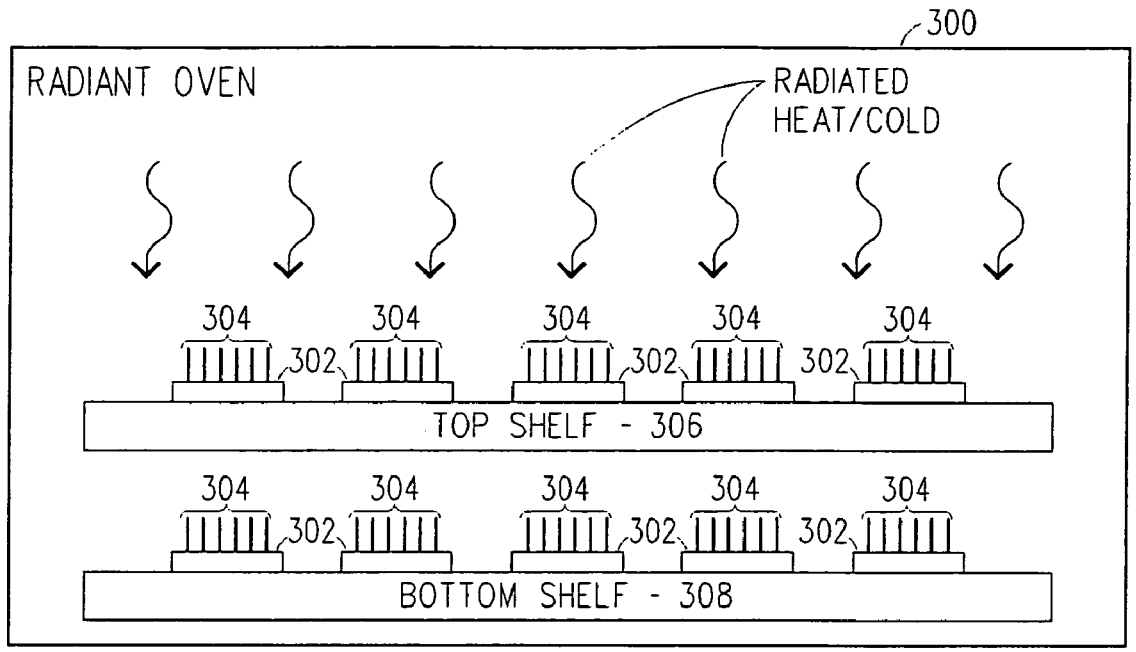
FIG. 3 (PRIOR ART) is a block diagram illustrating yet another traditional system including a radiant oven and open cassettes that are currently used to heat treat multiple glass sheets.

Referring to FIGS. 4-7, there are diagrams of a convection compatible closed cassette 400 and method 700 for using a lehr 500 to heat treat glass sheets 402 located within the closed cassette 400 in accordance with the present invention. For clarity, a detailed description about the structure of the closed cassette 400 is provided first with respect to FIGS. 4A-4D and then detailed descriptions about the lehr 500 and method 700 are provided with respect to FIGS. 5-7.

Referring to FIGS. 4A through 4D, there are shown different views of the closed cassette 400 which is used to hold and support multiple glass sheets 402 in accordance with the present invention. The closed cassette 400 includes a mounting structure 404 and multiple enclosed sections 406 (four shown). The mounting structure 404 includes a top frame 404a and a bottom frame 404b. The top frame 404a can be made from a single piece of material (e.g., stainless steel alloy) shaped in the form of a rectangle. Alternatively, the top frame 404a can be made from four pieces of material (e.g., stainless steel alloy) that are connected to one another to form a rectangle. The bottom frame 404b has the same shape as the top frame 404a.

The mounting structure 404 is used to hold and support a predetermined number of the individual enclosed sections 406 (four shown). As shown, the top frame 404a is located around the top portions of the supported enclosed sections 406. And, the bottom frame 404b is located around the bottom portions of the supported enclosed sections 406. The enclosed sections 406 are supported by the mounting structure 404 in a manner where there is an open passageway 408 (three shown) located between the major surfaces 412 of each pair of the supported enclosed sections 406. It should be appreciated that the mounting structure 404 can have any type of configuration so long that it can hold and support multiple enclosed sections 406 in a manner where there are open passageways 408 located between the major surfaces 412 of the supported enclosed sections 406.

Each enclosed section 406 is designed to hold and support one or more glass sheets 402 (typically 3-5 glass sheets 402) in a manner where there is a space 413 between the major surfaces 414 of each pair of the supported glass sheets 402. In one embodiment, the enclosed section 406 has a bottom side 416, four side walls 418a, 418b, 418c and 418d an open top side 420 (see FIGS. 4A and 4D). The open side 420 is covered by a removable lid 421 (see FIG. 4D). The four side walls 418a, 418b, 418c and 418d extend from the bottom side 416 and the open top side 420 to define therein an interior space that accommodates the glass sheets 402.

Figure 4A:
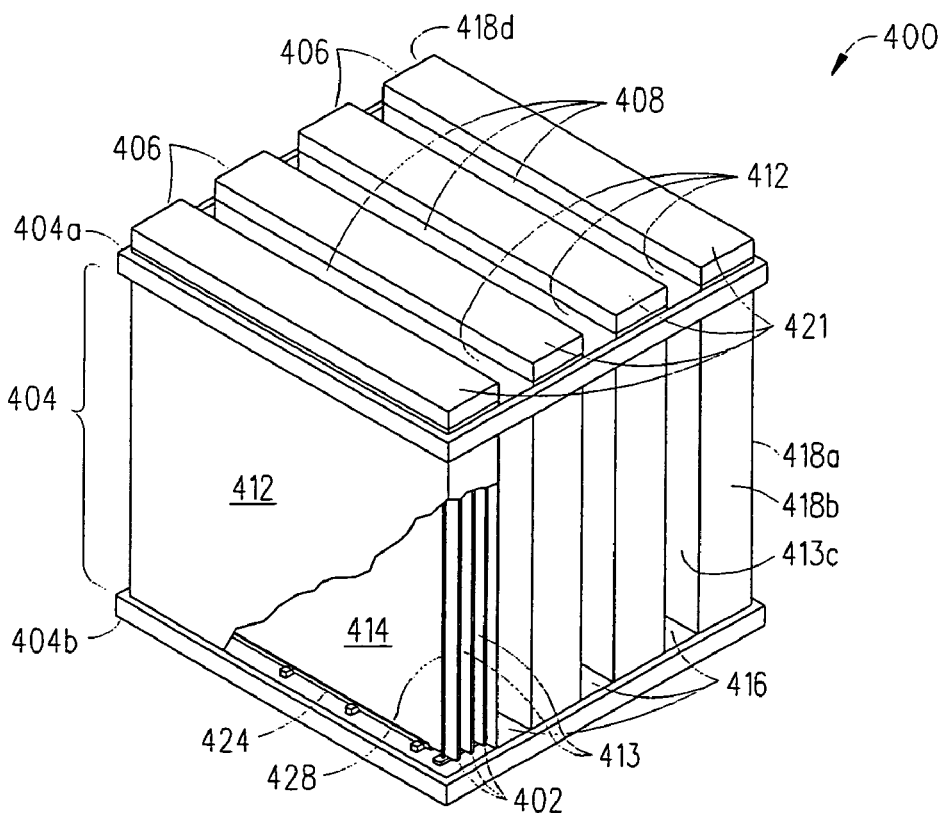
FIGS. 4A through 4D illustrate different views of a convection compatible closed cassette which is used to hold multiple glass sheets in accordance with the present invention.
Figure 4B:
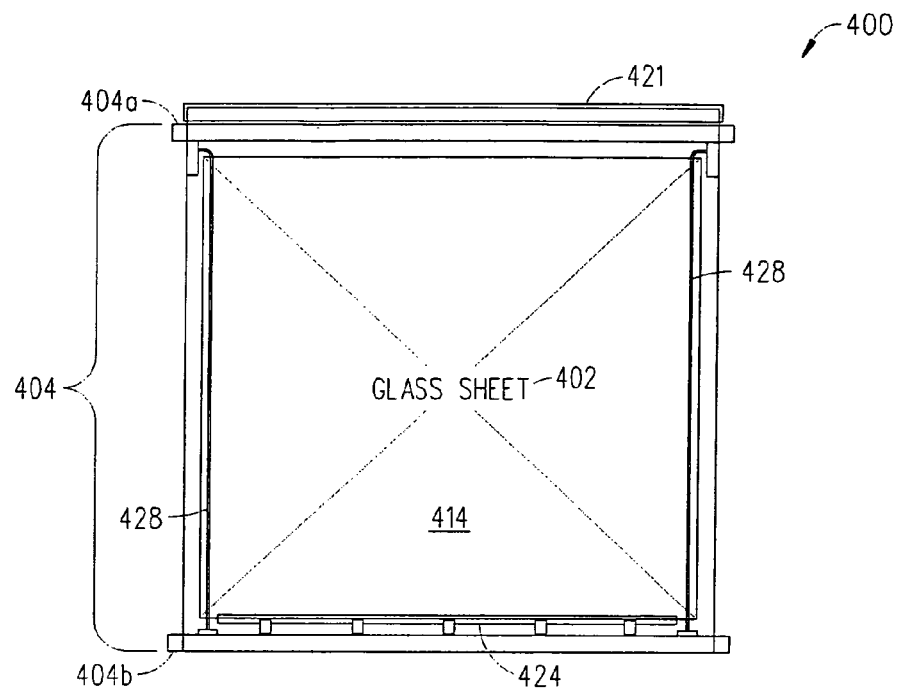
Figures 4C, 4D:
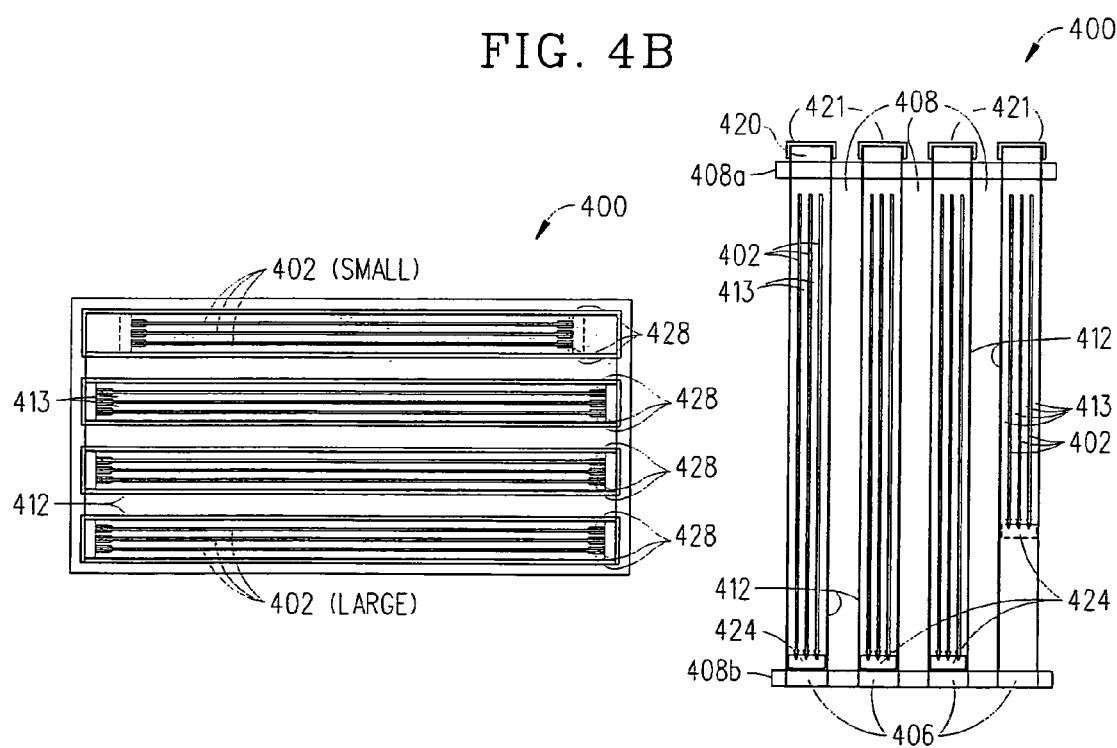

To support the glass sheets 402, the enclosed section 406 has adjustable horizontal support bars 424 ("V" support bars 424) which support the bottoms of the glass sheets 402. As shown in FIG. 4D, the horizontal support bars 424 can be moved up or down within the enclosed section 406 depending on the size of the glass sheets 402. In addition, the enclosed section 406 uses adjustable vertical support bars 428 (not shown in FIG. 4D) to support a portion of the major surfaces 414 of the glass sheets 402. As shown in FIG. 4C, the vertical support bars 428 can be moved left or right within the enclosed section 406 depending on the size of the glass sheets 402. As a result, the enclosed section 406 and in particular the adjustable support bars 424 and 428 can support different sizes of glass sheets 402. For example, a "large" glass sheet 402 could be 1300 mm (wide)×1600 mm (height)×0.7 mm (thick) (see FIGS. 4C and 4D). And, a "small" glass sheet 402 could be 1500 mm (wide)×1400 mm (height)×0.7 mm (thick) (see FIGS. 4C and 4D).

Figure 5:
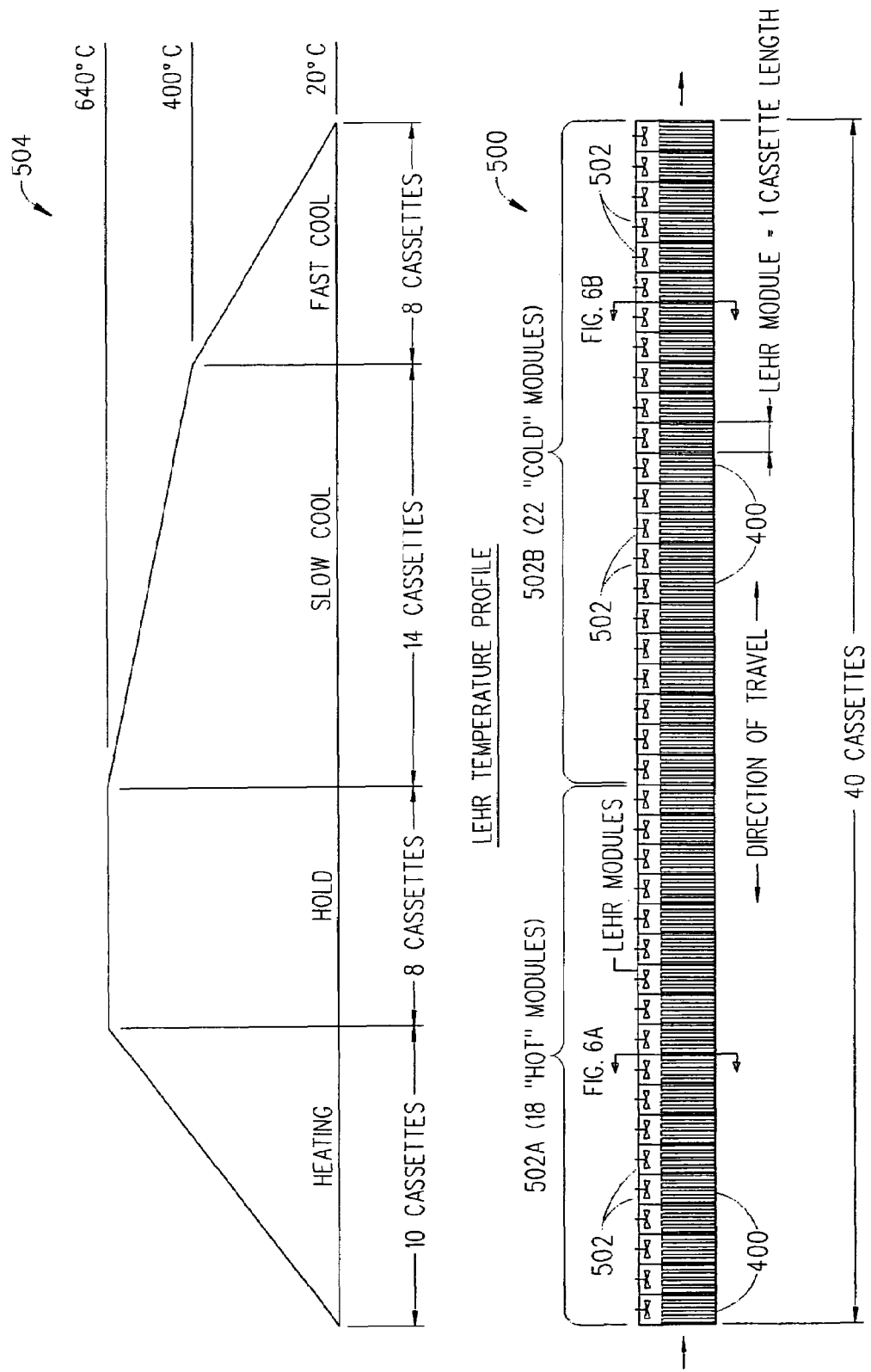
FIG. 5 is a cross-sectional side view of a traditional lehr that can be used to heat and cool glass sheets contained within convection compatible closed cassettes like the one which is shown in FIGS. 4A-4D.

Referring to FIG. 5, there is a cross-sectional side view of a traditional lehr 500 that can be used to heat and cool glass sheets 402 contained within the convection compatible closed cassettes 400 (forty shown). The exemplary lehr 500 shown includes forty modules 502 that heat and then cool forty cassettes 400 as they travel from left to right through the lehr 500. The closed cassettes 400 can be transported through the lehr 500 using anyone of a number of ways including a belt, driven rollers, walking beams, cars or carts (for example).

In operation, the closed cassettes 400 are oriented in the lehr 500 and moved through the lehr 500 in such a way that flowing unfiltered air can uniformly heat and cool the major surfaces 412 of the enclosed sections 406 which in turn uniformly heat and cool the major surfaces 414 of the glass sheets 402 contained within the enclosed sections 406. In this way, the glass sheets 402 are kept in a clean environment while they are uniformly heated and cooled by unfiltered air flowing over the major surfaces 412 of the enclosed sections 406. It should be appreciated that the thickness of the walls in each enclosed section 406 and the number of glass sheets 402 within each enclosed section 406 are kept small so as to minimize the temperature gradients within the glass sheets 402.

An exemplary temperature profile 504 is illustrated above the lehr 500 shown in FIG. 5 which indicates the various temperatures of the unfiltered air that is circulated within the modules 502 to heat and cool the closed cassettes 400. For instance, the first ten modules 502 can be used to uniformly heat the moving closed cassettes 400 from 20° C. to 640° C. The next eight modules 502 are used to hold the temperatures of the moving closed cassettes 400 at 640° C. Then the next fourteen modules 502 are used to uniformly cool the moving closed cassettes 400 at a relatively slow rate from 640° C. to 400° C. And, then the next eight modules 502 are used to uniformly cool the moving closed cassettes 400 at a relatively fast rate from 400° C. to 20° C. Of course there are many different heat/cool treat cycles that can be used to treat the glass sheets 402 depending on various factors like for example: (1) the size and number of glass sheets 402 in the enclosed section 406; (2) the thickness of the walls in the enclosed section 406; (3) the type of material used to make the enclosed section 406; (4) the speed the closed cassette 400 travels through the lehr 500; and (5) the number and types of modules 502 in the lehr 500.

Figure 6A:
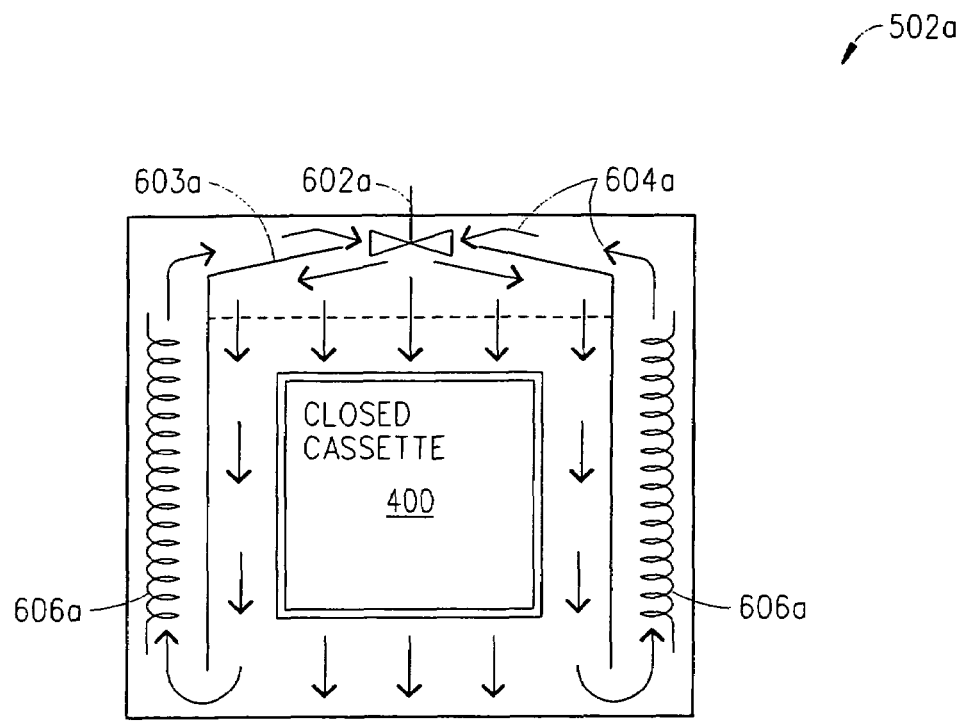
FIGS. 6A and 6B are cross-sectional side views of a heating module (FIG. 6A) and a cooling module (FIG. 6B) used in the traditional lehr shown in FIG. 5.

As can be seen in FIG. 5, the lehr 500 has modules 502 that are either heating modules 502a or cooling modules 502b. FIG. 6A illustrates a cross-sectional side view of an exemplary heating module 502a that can be incorporated within the lehr 500. The heating module 502a includes a re-circulating fan 602a that moves unfiltered air 604a which is heated by one or more heaters 606a (two shown) and directed by an air distribution plate 603a around the closed cassette 400. In the heating module 502a, the hot unfiltered air 604a flows through the open passageways 408 between the enclosed sections 406 in the closed cassette 400 so as to uniformly heat the major surfaces 412 of the enclosed sections 406 which in turn uniformly heats the glass sheets 402 contained within the enclosed sections 406 (see FIGS. 4A-4D). Again, the glass sheets 402 are kept in a clean environment while they are uniformly heated by the hot unfiltered air 604a that flows across the major surfaces 412 of the enclosed sections 406.

Figure 6B:
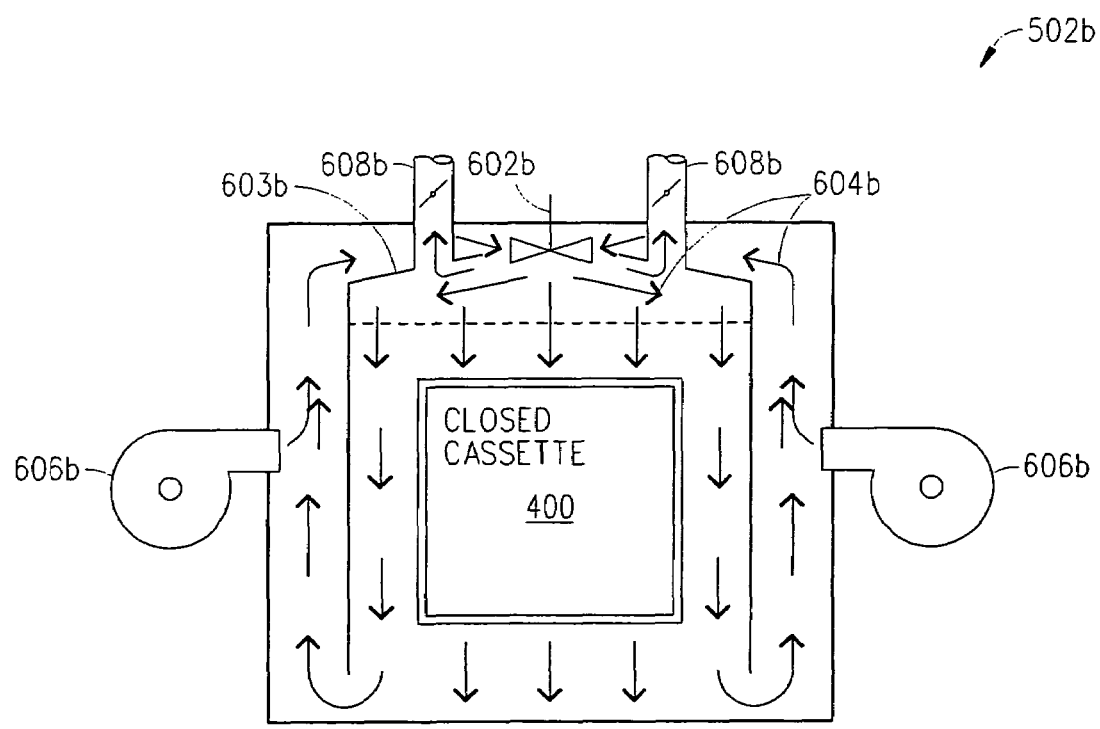

And, FIG. 6B illustrates a cross-sectional side view of an exemplary cooling module 502b that can be used in the lehr 500. The cooling module 502b includes a re-circulating fan 602b that moves unfiltered air 604b which is cooled by one or more cooling air fans 606b (two shown) and directed by an air distribution plate 603b around the closed cassette 400. As can be seen, the cooling module 502b also has one or more exhausts 608b (two shown) which are used to enable the re-cycling and re-cooling of the unfiltered air 604b. In the cooling module 502b, the cold unfiltered air 604b flows through the open passageways 408 between the enclosed sections 406 in the closed cassette 400 so as to uniformly cool the major surfaces 412 of the enclosed sections 406 which in turn uniformly cools the glass sheets 402 contained within the enclosed sections 406 (see FIGS. 4A-4D). Again, the glass sheets 402 are kept in a clean environment while they are uniformly cooled by the cold unfiltered air 604b that flows across the major surfaces 412 of the enclosed sections 406.

Figure 7:
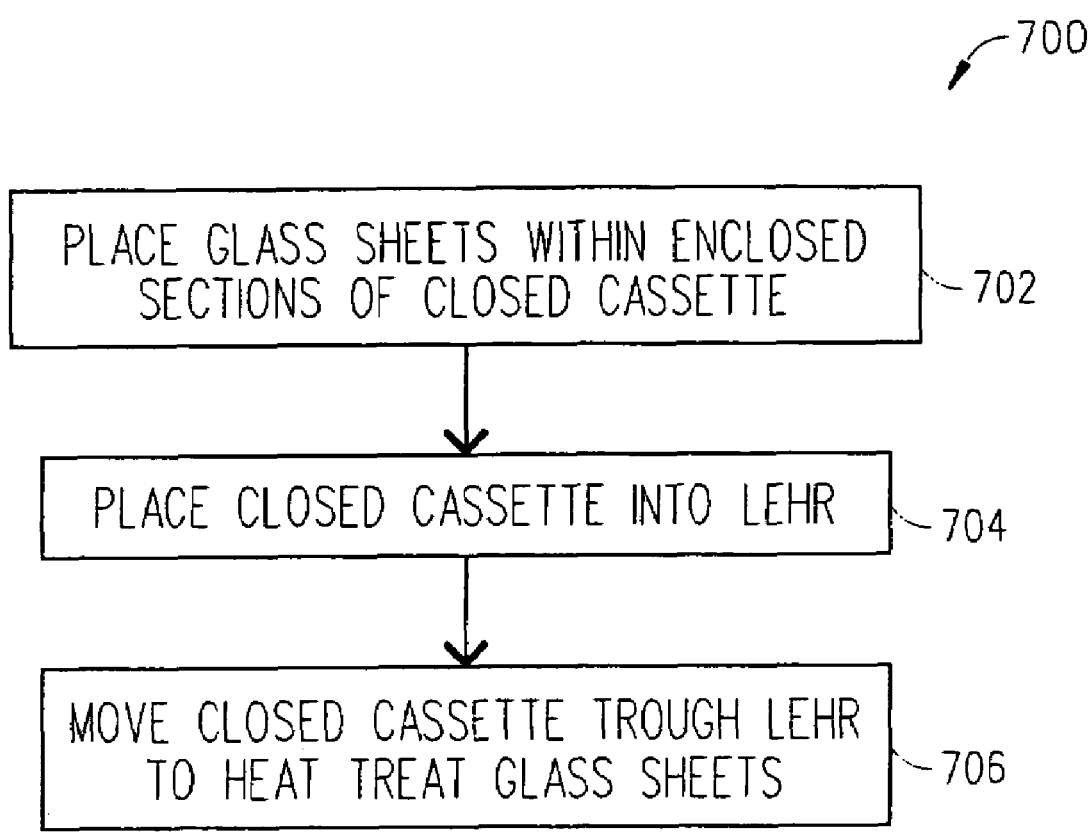
FIG. 7 is a flowchart illustrating the basic steps of a preferred method for using the closed cassette shown in FIGS. 4A-4D to heat treat glass sheets in accordance with the present invention.

Referring to FIG. 7, there is a flowchart illustrating the basic steps of the preferred method 700 for using the closed cassette 400 to heat treat glass sheets 402 in accordance with the present invention. Beginning at step 702, a robot or person places one or more glass sheets 402 into the closed cassette 400. Again, the closed cassette 400 includes one or more enclosed sections 406 that are supported by the mounting structure 404 in a manner where there is an open passageway 408 between the major surfaces 412 of each pair of the supported enclosed sections 406 (see FIG. 4A). And, each enclosed section 406 is designed to hold and support one or more glass sheets 402 in a manner where there is a space 413 between the major surfaces 414 of each pair of the supported glass sheets 402 (see FIG. 4A). At step 704, the closed cassette 400 is placed into the lehr 500 (see FIG. 5). Then at step 706, the closed cassette 400 is moved through the lehr during which hot/cold unfiltered air 604a and 604b flows across the major surfaces 412 of each enclosed section 406 to uniformly heat/cool the enclosed glass sheets 402 (see FIGS. 5, 6A and 6B). As described above, the closed cassettes 400 can be transported through the lehr 500 using anyone of a number of ways including a belt, driven rollers, walking beams, cars or carts (for example). And, the closed cassettes 400 are oriented in the lehr 500 and moved through the lehr 500 in such a way that flowing hot/cold unfiltered air 604a and 604b can uniformly heat/cool the major surfaces 412 of the enclosed sections 406 which in turn uniformly heat and cool the glass sheets 402 contained within the enclosed sections 406. In this way, the glass sheets 402 are kept in a clean environment while they are uniformly heated/cooled by the unfiltered air 604a and 604b moving across the major surfaces 412 of the enclosed sections 406. The thickness of the walls in each enclosed section 406 and the number of glass sheets 402 within each enclosed section 406 are kept small so as to minimize the temperature gradients within the glass sheets 402.

It should be appreciated that the closed cassette 400 can also be heat treated in a batch kiln (not shown). In this case, the closed cassette 400 would be placed in the batch kiln and would remain stationary therein while hot/cold air flowed across the major surfaces 412 of the enclosed sections 406.

Following are some additional features, advantages and/or uses of the present invention:

The closed cassette 400 can be heated and/or cooled in a variety of ovens beside the aforementioned lehr 500 and batch kiln. For instance, the closed cassette 400 may be heated and/or cooled in a batch oven or a traditional re-circulating air oven (see FIG. 1).

The heating modules 502a and cooling modules 502b shown have unfiltered air 604a and 604b flowing "down" over the closed cassette 400. However, the heating modules 502a and cooling modules 502b can be designed to move the unfiltered air 604a and 604b in any direction over the closed cassette 400. For instance, the heating modules 502a and cooling modules 502b can be designed to move the unfiltered air 604a and 604b from left-to-right over the closed cassette 400.

It should be appreciated that the enclosed sections 406 in the closed cassette 400 can be purged with an inert gas such as nitrogen to help prevent oxidation of the inside walls of the enclosed sections 406.

The glass sheets 402 can be made in accordance with a fusion process which is one technique for producing sheets of glass used in liquid crystal displays (LCDs). The fusion process is described in U.S. Pat. Nos. 3,338,696 and 3,682,609, the contents of which are incorporated herein by reference.

Although one embodiment of the present invention has been illustrated in the accompanying Drawings and described in the foregoing Detailed Description, it should be understood that the invention is not limited to the embodiment disclosed, but is capable of numerous rearrangements, modifications and substitutions without departing from the spirit of the invention as set forth and defined by the following claims.

What is claimed is:

1. A method for heat treating a plurality of glass sheets, said method comprising the steps of:

placing a first plurality of the glass sheets within a first closed cassette, wherein said first closed cassette includes:

a first mounting structure;

a first plurality of enclosed sections that are supported by said first mounting structure such that each enclosed section is physically separated from their adjacent enclosed section(s) in a manner where there is an open passageway between major surfaces of each pair of the supported enclosed sections; and each enclosed section is designed to hold and support a portion of the first plurality of glass sheets in a manner where there is a space between major surfaces of each pair of the supported glass sheets;

placing a second plurality of glass sheets within a second closed cassette, wherein said second closed cassette includes:

a second mounting structure;

a second plurality of enclosed sections that are supported by said second mounting structure such that each enclosed section is physically separated from their adjacent enclosed section(s) in a manner where there is an open passageway between major surfaces of each pair of the supported enclosed sections; and each enclosed section is designed to hold and support a portion of the second plurality of glass sheets in a manner where there is a space between major surfaces of each pair of the supported glass sheets;

placing the first closed cassette and the second closed cassette into an oven; and operating the oven such that hot air flows across the major surfaces of each enclosed section of the first closed cassette and the second closed cassette to heat said glass sheets.

2. The method of claim 1, further comprising the step of operating the oven such that cold air flows across the major surfaces of each enclosed section to cool said glass sheets.

3. The method of claim 1, wherein each enclosed section has relatively thin walls so as to minimize temperature gradients within said glass sheets supported therein while said glass sheets are uniformly heated by the air moving within said oven.

4. The method of claim 1, wherein each enclosed section supports a predetermined number of glass sheets so as to minimize temperature gradients within said glass sheets supported therein while said glass sheets are uniformly heated by the air moving within said oven.

5. The method of claim 1, wherein each enclosed section includes:

a plurality of adjustable horizontal support bars, where said plurality of adjustable horizontal support bars move in an upward or downward direction and each of the adjustable horizontal support bars individually support at least a portion of a bottom of one of the plurality of glass sheets.

6. The method of claim 1, wherein each enclosed section includes:

a plurality of adjustable right vertical support bars, where said plurality of adjustable right vertical support bars move in a sideways direction and each of the adjustable right vertical support bars individually support at least a portion of a right side of one of the plurality of glass sheets; and a plurality of adjustable left vertical support bars, where said plurality of adjustable left vertical support bars move in a sideways direction and each of the adjustable left vertical support bars individually support at least a portion of a left side of one of the plurality of glass sheets.

7. A system comprising:

an oven; and a first convection compatible closed cassette that includes:

a first mounting structure;

a first plurality of enclosed sections that are supported by said first mounting structure such that each enclosed section is physically separated from their adjacent enclosed section(s) in a manner where there is an open passageway between major surfaces of each pair of the supported enclosed sections; and each enclosed section is designed to hold and support a first plurality of glass sheets in a manner where there is a space between major surfaces of each pair of the supported glass sheets;

a second convection compatible closed cassette that includes:

a second mounting structure;

a second plurality of enclosed sections that are supported by said second mounting structure such that each enclosed section is physically separated from their adjacent enclosed section(s) in a manner where there is an open passageway between major surfaces of each pair of the supported enclosed sections; and each enclosed section is designed to hold and support a second plurality of glass sheets in a manner where there is a space between major surfaces of each pair of the supported glass sheets;

wherein said glass sheets are kept in a clean environment while being heated and then cooled by air moving across the major surfaces of each enclosed section when said first convection compatible closed cassette and second convection compatible closed cassette are located in said oven.

8. The system of claim 7, wherein each enclosed section has relatively thin walls so as to minimize temperature gradients within said glass sheets supported therein while said glass sheets are heated and then cooled by the air moving within said oven.

9. The system of claim 7, wherein each enclosed section supports a predetermined number of glass sheets so as to minimize temperature gradients within said glass sheets supported therein while said glass sheets are heated and then cooled by the air moving within said oven.

10. The system of claim 7, wherein said air is unfiltered air.

11. The system of claim 7, wherein each enclosed section includes:

a plurality of adjustable horizontal support bars, where said plurality of adjustable horizontal support bars move in an upward or downward direction and each of the adjustable horizontal support bars individually support at least a portion of a bottom of one of the plurality of glass sheets.

12. The system of claim 7, wherein each enclosed section includes:

a plurality of adjustable right vertical support bars, where said plurality of adjustable right vertical support bars move in a sideways direction and each of the adjustable right vertical support bars individually support at least a portion of a right side of one of the plurality of glass sheets; and a plurality of adjustable left vertical support bars, where said plurality of adjustable left vertical support bars move in a sideways direction and each of the adjustable left vertical support bars individually support at least a portion of a left side of one of the plurality of glass sheets.

* * * * *